US008369169B2

(12) United States Patent
Won

(10) Patent No.: US 8,369,169 B2
(45) Date of Patent: Feb. 5, 2013

(54) SENSE AMPLIFIER AND SEMICONDUCTOR MEMORY DEVICE INCLUDING THE SAME

(75) Inventor: Hyung-Sik Won, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 179 days.

(21) Appl. No.: 12/642,184

(22) Filed: Dec. 18, 2009

(65) Prior Publication Data

US 2011/0038220 A1 Feb. 17, 2011

(30) Foreign Application Priority Data

Aug. 11, 2009 (KR) .................. 10-2009-0074016

(51) Int. Cl.
*G11C 7/02* (2006.01)
(52) U.S. Cl. ....................................... 365/207
(58) Field of Classification Search .............. 365/207
See application file for complete search history.

(56) References Cited

U.S. PATENT DOCUMENTS

| 5,646,516 | A | * | 7/1997 | Tobita .................. 323/313 |
| 6,041,012 | A | * | 3/2000 | Banba et al. ............ 365/226 |
| 6,107,134 | A | * | 8/2000 | Lu et al. ................. 438/239 |
| 2007/0152736 | A1 | * | 7/2007 | Itoh et al. ............... 327/534 |

FOREIGN PATENT DOCUMENTS

| KR | 1019900015147 | 10/1990 |
| KR | 1019970051247 | 7/1997 |

OTHER PUBLICATIONS

Notice of Allowance issued from Korean Intellectual Property Office on Mar. 30, 2011.

* cited by examiner

*Primary Examiner* — Anthan Tran
(74) *Attorney, Agent, or Firm* — IP & T Group LLP

(57) ABSTRACT

A sense amplifier includes a first inverter having an input terminal connected to a first line and an output terminal connected to a second line, and a second inverter having an input terminal connected to the second line and an output terminal connected to the first line, wherein an NMOS transistor of the first inverter and an NMOS transistor of the second inverter have well biases different from each other.

5 Claims, 3 Drawing Sheets

SENSE AMPLIFIER AND SEMICONDUCTOR MEMORY DEVICE INCLUDING THE SAME

CROSS-REFERENCE TO RELATED APPLICATIONS

The present application claims priority of Korean Patent Application No. 10-2009-0074016, filed on Aug. 11, 2009, which is incorporated herein by reference in its entirety.

BACKGROUND OF THE INVENTION

Exemplary embodiments of the present invention relate to a semiconductor memory device, and more particularly, to a bitline sense amplifier.

A basic operation of a memory device is to write or store an external data, and read the written or stored data. A basic unit for storing data is called a cell. In such a memory device, one capacitor is used for storing one data. To precisely read data stored in the capacitor and precisely transfer the read data to the outside, the polarity of the data stored in the cell must be correctly determined. Therefore, a bitline sense amplifier (BLSA) for sensing and amplifying data is provided in the semiconductor memory device.

FIG. 1 is a circuit diagram of a conventional semiconductor memory device including a cell array and a bitline sense amplifier.

Referring to FIG. 1, a bitline pair BL and /BL coupled to a bitline sense amplifier 110 is precharged to a precharge voltage VBLP in a normal mode. When a word line WL1 is enabled, a cell transistor 101 coupled to the word line WL1 is turned on, and data stored in a capacitor is transferred to the bitline BL through a channel of the cell transistor 101 (charge sharing). At this time, the bitline bar /BL maintains the precharge voltage VBLP, and the potential of the bitline BL is changed through charge sharing.

The bitline sense amplifier 110 senses and amplifies a potential difference (dV) between the bitline BL and the bitline bar /BL.

Unlike an ideal bitline sense amplifier, a real bitline sense amplifier may not exactly sense and amplify a very slight potential difference (dV) between the bitline pair BL and /BL. A sensing operation is successfully performed when the potential difference (dV) between the bitline pair BL and /BL is more than a predetermined level, and this potential difference (dV) is called an offset voltage of the bitline sense amplifier 110. If the potential difference (dV) between the bitline BL and the bitline bar /BL is less than the offset voltage, the bitline sense amplifier 110 may not ensure a correct sensing operation. That is, a sensing margin is reduced. One of factors that causes the offset voltage may be a mismatch of the bitline sense amplifier 110. The bitline sense amplifier 110 includes a latch configured with two inverters. PMOS transistor pairs and NMOS transistor pairs constituting the two inverters must be equally fabricated. However, in practice, a structural layout may not be designed to be exactly symmetrical. Even though the layout is designed to be symmetrical, patterns may not be exactly formed as designed. Moreover, contacts may not be equally defined. For the above and other reasons, the mismatch of the bitline sense amplifier 110 may always exist. Therefore, there is a need for a technology that can easily determine and regulate the mismatch of the bitline sense amplifier 110.

In general, a high voltage VPP higher than a power supply voltage is used as a well bias of a PMOS transistor constituting the bitline sense amplifier 110, and a low voltage VBB lower than a ground voltage is used as a well bias of an NMOS transistor constituting the bitline sense amplifier 110. In FIG. 1, a pull-up voltage of the bitline sense amplifier 110 is supplied through a line RTO, and a pull-down voltage of the bitline sense amplifier 110 is supplied through a line SB. When a bitline isolation signal BIS is activated, the cell array and the bitline sense amplifier 110 are electrically coupled to each other. When the bitline isolation signal BIS is deactivated, the cell array and the bitline sense amplifier 110 are electrically decoupled from each other. Moreover, when a bitline equalization signal BLEQ is activated, the bitline pair BL and /BL is precharged to the precharge voltage VBLP.

SUMMARY OF THE INVENTION

An embodiment of the present invention is directed to providing a technology capable of easily determining and regulating a mismatch of a bitline sense amplifier.

In accordance with an embodiment of the present invention, a sense amplifier includes a first inverter having an input terminal coupled to a first line and an output terminal coupled to a second line, and a second inverter having an input terminal coupled to the second line and an output terminal coupled to the first line, wherein an NMOS transistor of the first inverter and an NMOS transistor of the second inverter have well biases different from each other.

A PMOS transistor of the first inverter and a PMOS transistor of the second inverter may have well biases different from each other.

A first high voltage may be applied as the well bias of the PMOS transistor of the first inverter, a second high voltage may be applied as the well bias of the PMOS transistor of the second inverter, a first low voltage may be applied as the well bias of the NMOS transistor of the first inverter, and a second low voltage may be applied as the well bias of the PMOS transistor of the second inverter.

The first high voltage and the second high voltage may be independently adjusted, and the first low voltage and the second low voltage may be independently adjusted.

The first line and the second line may include bitlines.

In accordance with another embodiment of the present invention, a sense amplifier includes a first inverter having an input terminal coupled to a first line and an output terminal coupled to a second line, and a second inverter having an input terminal coupled to the second line and an output terminal coupled to the first line, wherein a PMOS transistor of the first inverter and a PMOS transistor of the second inverter have well biases different from each other.

A first high voltage may be applied as the well bias of the PMOS transistor of the first inverter, and a second high voltage may be applied as the well bias of the PMOS transistor of the second inverter.

The first high voltage and the second high voltage may be independently adjusted.

The first line and the second line may include bitlines.

In accordance with another embodiment of the present invention, a semiconductor memory device includes a voltage generator configured to generate a first high voltage, a second high voltage, a first low voltage, and a second low voltage, and a sense amplifier comprising a first inverter and a second inverter constituting a latch between a first line and a second line, wherein the first high voltage and the first low voltage are used as well biases of the first inverter, and the second high voltage and the second low voltage are used as well biases of the second inverter.

The voltage generator may include a first high voltage generator configured to generate the first high voltage, a second high voltage generator configured to generate the second high voltage, a first low voltage generator configured to generate the first low voltage, and a second low voltage generator configured to generate the second low voltage.

The semiconductor memory device may further include a high voltage switch configured to connect an output terminal of the first high voltage generator to an output terminal of the second high voltage generator in response to a first control signal, and a low voltage switch configured to connect an output terminal of the first low voltage generator to an output terminal of the second low voltage generator in response to a second control signal.

The semiconductor memory device may further include a first high voltage capacitor coupled to the output terminal of the first high voltage generator, a second high voltage capacitor coupled to the output terminal of the second high voltage generator, a first low voltage capacitor coupled to the output terminal of the first low voltage generator, and a second low voltage capacitor coupled to the output terminal of the first low voltage generator.

The first high voltage generator may adjust the level of the first high voltage in response to a first high voltage tuning signal, the second high voltage generator may adjust the level of the second high voltage in response to a second high voltage tuning signal, the first low voltage generator may adjust the level of the first low voltage in response to a first low voltage tuning signal, and the second low voltage generator may adjust the level of the second low voltage in response to a second low voltage tuning signal.

The first line and the second line may include bitlines.

DESCRIPTION OF SPECIFIC EMBODIMENTS

Figure 1:
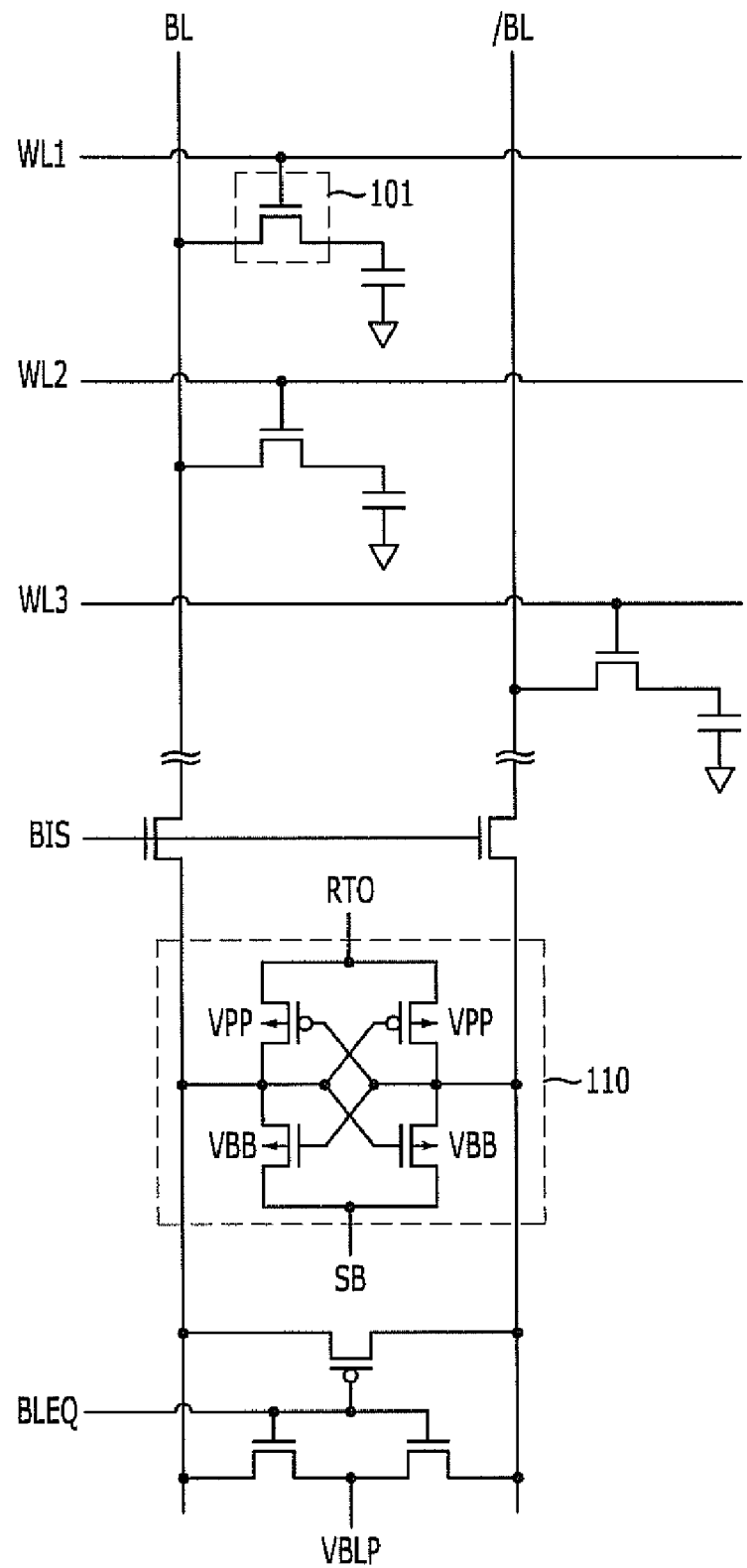
FIG. 1 is a circuit diagram of a conventional semiconductor memory device including a cell array and a bitline sense amplifier.

Exemplary embodiments of the present invention will be described below in more detail with reference to the accompanying drawings. The present invention may, however, be embodied in different forms and should not be construed as limited to the embodiments set forth herein. Rather, these embodiments are provided so that this application will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments.

Figure 2:
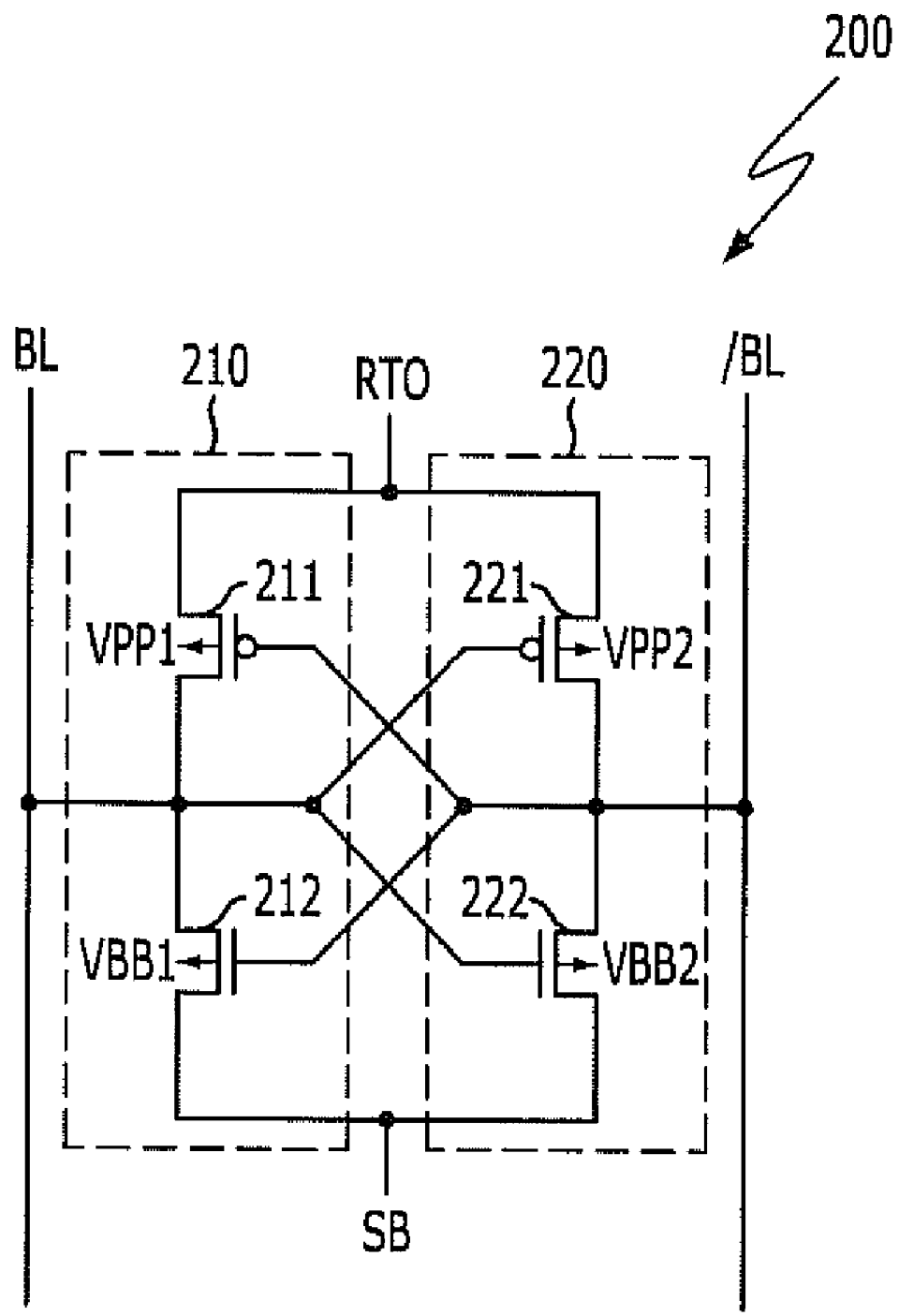
FIG. 2 is a circuit diagram of a bitline sense amplifier in accordance with an embodiment of the present invention.

FIG. 2 is a circuit diagram of a bitline sense amplifier in accordance with an embodiment of the present invention.

Referring to FIG. 2, the bitline sense amplifier 200 in accordance with an embodiment of the present invention includes a first inverter 210 and a second inverter 220. The first inverter 210 has an input terminal coupled to a first bitline BL, and an output terminal coupled to a second bitline /BL. The second inverter 220 has an input terminal coupled to the second bitline /BL, and an output terminal coupled to the first bitline BL.

As opposed to the prior art, well biases of transistors constituting the first inverter 210 and the second inverter 220 of the bitline sense amplifier 200 in accordance with the embodiment of the present invention are separated from each other. Specifically, different well biases are applied to a PMOS transistor 211 of the first inverter 210 and a PMOS transistor 221 of the second inverter 220, and different well biases are applied to an NMOS transistor 212 of the first inverter 210 and an NMOS transistor 222 of the second inverter 220.

A first high voltage VPP1 is applied as the well bias of the PMOS transistor 211, and a second high voltage VPP2 is applied as the well bias of the PMOS transistor 221. In addition, a first low voltage VBB1 is applied as the well bias of the NMOS transistor 212, and a second low voltage VBB2 is applied as the well bias of the NMOS transistor 222. Characteristics of the transistors, such as a threshold voltage, are varied according to voltages applied as the well biases of the transistors. In accordance with an embodiment of the present invention, a mismatch of the inverter pair 210 and 220 may be intentionally caused and regulated by varying the well biases VPP1, VPP2, VBB1, and VBB2 for the inverters 210 and 220. If the mismatch of the inverter pair 210 and 220 is freely caused and regulated, the possible worst mismatch situation of the bitline sense amplifier 200 can be known. Consequently, a defect screening ability may be improved.

In general, a positive pumping voltage VPP higher than a power supply voltage VDD is used as the high voltages applied to the well biases of the PMOS transistors 211 and 221 constituting the bitline sense amplifier 200, and a negative pumping voltage VBB lower than a ground voltage VSS is used as the low voltages applied to the well biases of the NMOS transistors 212 and 222 constituting the bitline sense amplifier 200. However, the present invention is not limited to the above-described embodiment. For example, voltages lower than the power supply voltage VDD may be used as the well biases of the PMOS transistors 211 and 221, and voltages higher the ground voltage VSS may be used as the well biases of the NMOS transistors 212 and 222.

As illustrated in FIG. 2, the PMOS transistors 211 and 221 and the NMOS transistors 212 and 222 constituting the inverters 210 and 220 have separate well biases. However, in another embodiment, the inverters 210 and 220 may be constructed so that only the PMOS transistors 211 and 221 have separate well biases, while the NMOS transistors 212 and 222 have shared well biases.

Figure 3:
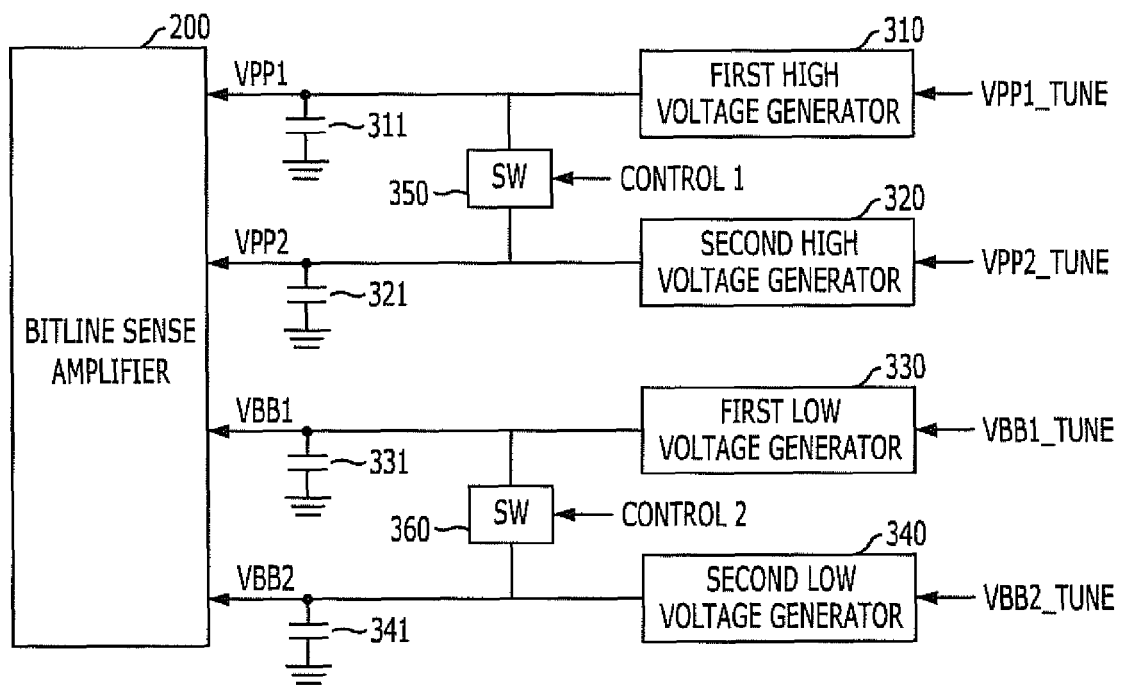
FIG. 3 is a configuration diagram of a semiconductor memory device in accordance with an embodiment of the present invention.

FIG. 3 is a configuration diagram of a semiconductor memory device in accordance with an embodiment of the present invention.

Referring to FIG. 3, the semiconductor memory device in accordance with the embodiment of the present invention includes a voltage generator 300 and a bitline sense amplifier 200 (see FIG. 2). The voltage generator 300 generates a first high voltage VPP1, a second high voltage VPP2, a first low voltage VBB1, and a second low voltage VBB2. The bitline sense amplifier 200 includes a first inverter and a second inverter constituting a latch between a first bitline BL and a second bitline /BL. The first high voltage VPP1 and the first low voltage VBB1 are used as well biases of the first inverter, and the second high voltage VPP2 and the second low voltage VBB2 are used as well biases of the second inverter. The semiconductor memory device may further include a high voltage switch 350 and a low voltage switch 360. The high voltage switch 350 makes levels of the first high voltage VPP1 and the second high voltage VPP2 equal to each other or different from each other, and the low voltage switch 360 makes levels of the first low voltage VBB1 and the second low voltage VBB2 equal to each other or different from each other.

The voltage generator 300 is configured to generate a variety of voltages VPP1, VPP2, VBB1 and VBB2, and may include a first high voltage generator 310, a second high voltage generator 320, a first low voltage generator 330, and a second low voltage generator 340.

The first high voltage generator 310 adjusts the level of the first high voltage VPP1 in response to a first high voltage tuning signal VPP1_TUNE. That is, the level of the first high voltage VPP1 generated by the first high voltage generator 310 is changed according to information of the first high voltage tuning signal VPP1_TUNE. A first high voltage capacitor 311 coupled to an output terminal of the first high voltage generator 310 is a reservoir capacitor.

The second high voltage generator 320 adjusts the level of the second high voltage VPP2 in response to a second high voltage tuning signal VPP2_TUNE. That is, the level of the second high voltage VPP2 generated by the second high voltage generator 320 is changed according to information of the second high voltage tuning signal VPP2_TUNE. A second high voltage capacitor 321 coupled to an output terminal of the second high voltage generator 320 is a reservoir capacitor.

The first low voltage generator 330 adjusts the level of the first low voltage VBB1 in response to a first low voltage tuning signal VBB1_TUNE. That is, the level of the first low voltage VBB1 generated by the first low voltage generator 330 is changed according to information of the first low voltage tuning signal VBB1_TUNE. A first low voltage capacitor 331 coupled to an output terminal of the first low voltage generator 330 is a reservoir capacitor.

The second low voltage generator 340 adjusts the level of the second low voltage VBB2 in response to a second low voltage tuning signal VBB2_TUNE. That is, the level of the second low voltage VBB2 generated by the second low voltage generator 340 is changed according to information of the second low voltage tuning signal VBB2_TUNE. A second low voltage capacitor 341 coupled to an output terminal of the second low voltage generator 340 is a reservoir capacitor.

The high voltage switch 350 is turned on/off in response to a first control signal CONTROL1. If the high voltage switch 350 is turned on, the levels of the first high voltage VPP1 and the second high voltage VPP2 become equal to each other. If the high voltage switch 350 is turned off, the first high voltage VPP1 and the second high voltage VPP2 have the levels of the voltages generated by the first high voltage generator 310 and the second high voltage generator 320, respectively.

The low voltage switch 360 is turned on/off in response to a second control signal CONTROL2. If the low voltage switch 360 is turned on, the levels of the first low voltage VBB1 and the second low voltage VBB2 become equal to each other. If the low voltage switch 360 is turned off, the first low voltage VBB1 and the second low voltage VBB2 have the levels of the voltages generated by the first low voltage generator 330 and the second low voltage generator 340, respectively.

By adjusting the signals VPP1_TUNE, VPP2_TUNE2, VBB1_TUNE, VBB2_TUNE, CONTROL1, and CONTROL2, the well biases inputted to the transistors constituting the bitline sense amplifier may be freely controlled. Therefore, the characteristics of the bitline sense amplifier may be freely controlled.

The signals VPP1_TUNE, VPP2_TUNE2, VBB1_TUNE, VBB2_TUNE, CONTROL1, and CONTROL2 are test mode signals. Levels of such test mode signals may be determined by mode register settings. The test mode signals may be inputted from external pads. Since the assignment and control of the test mode signals are easily conducted by those of ordinary skill in the art, further detailed description will be omitted.

In accordance with the embodiments of the present invention, the well biases of the inverters constituting the latch of the bitline sense amplifier are separated from one another. Therefore, immunity to noise inputted through the wells during the operation of the bitline sense amplifier may increase.

Moreover, the generation of mismatch is controlled by intentionally adjusting the well biases to different voltage levels. Therefore, an ability to screen the mismatch of the transistors constituting the bitline sense amplifier may be improved, thereby improving a sensing margin.

While the present invention has been described with respect to the specific embodiments, it will be apparent to those skilled in the art that various changes and modifications may be made without departing from the spirit and scope of the invention as defined in the following claims.

Although the folded bitline architecture is illustrated in the drawings, the present invention can also be applied to an open bitline architecture because the bitline sense amplifier having the same structure as in the folded bitline architecture is used.

Furthermore, although the bitline sense amplifier amplifying the potential difference between two bitlines is illustrated in the drawings, it is apparent that the present invention can also be applied to a sense amplifier amplifying a potential difference between two lines, other than the bitlines.

Moreover, although only one bitline sense amplifier is illustrated in the drawings, it is apparent that a plurality of bitline sense amplifiers are provided in the semiconductor memory device.

What is claimed is:

1. A semiconductor memory device, comprising:
a voltage generator configured to generate a first high voltage, a second high voltage, a first low voltage, and a second low voltage; and
a sense amplifier comprising a first inverter and a second inverter constituting a latch between a first line and a second line, wherein an NMOS transistor of the first inverter and an NMOS transistor of the second inverter have well biases different from each other and a PMOS transistor of the first inverter and a PMOS transistor of the second inverter have well biases different from each other,
wherein the first high voltage and the first low voltage are used as well biases of the first inverter, and the second high voltage and the second low voltage are used as well biases of the second inverter,
wherein the voltage generator comprises:
a first high voltage generator configured to generate the first high voltage and adjust the level of the first high voltage in response to a first high voltage tuning signal;
a second high voltage generator configured to generate the second high voltage and adjust the level of the second high voltage in response to a second high voltage tuning signal;
a first low voltage generator configured to generate the first low voltage and adjust the level of the first low voltage in response to a first low voltage tuning signal; and
a second low voltage generator configured to generate the second low voltage and adjust the level of the second low voltage in response to a second low voltage tuning signal.

2. The semiconductor memory device of claim 1, further comprising:
 a high voltage switch configured to connect an output terminal of the first high voltage generator to an output terminal of the second high voltage generator in response to a first control signal; and
 a low voltage switch configured to connect an output terminal of the first low voltage generator to an output terminal of the second low voltage generator in response to a second control signal.

3. The semiconductor memory device of claim 2, further comprising:
 a first high voltage capacitor coupled to the output terminal of the first high voltage generator;
 a second high voltage capacitor coupled to the output terminal of the second high voltage generator;
 a first low voltage capacitor coupled to the output terminal of the first low voltage generator; and
 a second low voltage capacitor coupled to the output terminal of the first low voltage generator.

4. The semiconductor memory device of claim 1, wherein the first line and the second line comprise bitlines.

5. The semiconductor memory device of claim 1, further comprising:
 a high voltage switch configured to make levels of the first high voltage and the second high voltage equal to each other or different from each other; and
 a low voltage switch configured to make levels of the first low voltage and the second low voltage equal to each other or different from each other.

* * * * *